(12) United States Patent
Hung et al.

(10) Patent No.: US 9,514,834 B2
(45) Date of Patent: *Dec. 6, 2016

(54) RETENTION LOGIC FOR NON-VOLATILE MEMORY

(71) Applicant: MACRONIX INTERNATIONAL CO., LTD., Hsinchu (TW)

(72) Inventors: Chun-Hsiung Hung, Hsinchu (TW); Nai-Ping Kuo, Hsinchu (TW); Kuen-Long Chang, Hsinchu (TW); Ken-Hui Chen, Hsinchu (TW); Yu-Chen Wang, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/867,660

(22) Filed: Sep. 28, 2015

(65) Prior Publication Data

US 2016/0027522 A1    Jan. 28, 2016

Related U.S. Application Data

(63) Continuation of application No. 13/903,574, filed on May 28, 2013, now Pat. No. 9,147,501.

(Continued)

(51) Int. Cl.
*G11C 29/00* (2006.01)
*G11C 16/34* (2006.01)
(Continued)

(52) U.S. Cl.
CPC .......... *G11C 16/34* (2013.01); *G11C 16/0466* (2013.01); *G11C 16/10* (2013.01); *G11C 16/26* (2013.01); *G11C 16/30* (2013.01); *G11C 16/349* (2013.01); *G11C 16/3418* (2013.01); *G11C 16/3431* (2013.01); *G11C 29/12005* (2013.01)

(58) Field of Classification Search
CPC ......... G11C 16/34; G11C 16/10; G11C 16/26; G11C 16/30; G11C 16/0466
See application file for complete search history.

(56) References Cited

U.S. PATENT DOCUMENTS 5,574,684 A    11/1996    Tomoeda
5,835,429 A    11/1998    Schwarz
(Continued)

FOREIGN PATENT DOCUMENTS

EP    1253599 A1    10/2002
JP    2000228094 A    8/2000
JP    2006338789 A    12/2006

OTHER PUBLICATIONS

EP Search Report from family member case Application No. 13174686.9, Dec. 2, 2014, 10 pages.

*Primary Examiner* — Esaw Abraham
(74) *Attorney, Agent, or Firm* — Haynes Beffel & Wolfeld LLP

(57) ABSTRACT

An integrated circuit memory device includes an array of non-volatile, charge trapping memory cells, configured to store data values in memory cells in the array using threshold states, including a higher threshold state. Retention check logic executes to identify memory cells in the higher threshold state which fail a threshold retention check. Also, logic is provided to reprogram the identified memory cells.

20 Claims, 5 Drawing Sheets

Related U.S. Application Data

(60) Provisional application No. 61/780,942, filed on Mar. 13, 2013.

(51) Int. Cl.
  G11C 29/12 (2006.01)
  G11C 16/04 (2006.01)
  G11C 16/10 (2006.01)
  G11C 16/26 (2006.01)
  G11C 16/30 (2006.01)

(56) References Cited

U.S. PATENT DOCUMENTS

| | | |
|---|---|---|
| 7,139,192 B1 | 11/2006 | Wong |
| 7,394,688 B2 | 7/2008 | Furuta et al. |
| 7,457,163 B2 * | 11/2008 | Hemink ............ G11C 11/5628 365/185.02 |
| 7,729,193 B2 * | 6/2010 | Zanders ................. G11C 5/14 365/185.08 |
| 7,808,820 B2 | 10/2010 | Wong |
| 7,948,263 B2 | 5/2011 | Kim et al. |
| 8,027,196 B1 | 9/2011 | Wong |
| 8,213,236 B1 * | 7/2012 | Wu .......................... G11C 7/04 365/185.24 |
| 8,320,176 B2 * | 11/2012 | La Rosa ............ G11C 16/0441 365/185.01 |
| 8,365,030 B1 | 1/2013 | Choi et al. |
| 8,446,778 B2 | 5/2013 | Kim |
| 8,456,214 B2 * | 6/2013 | Frederick, Jr. ....... H03K 5/1534 327/208 |
| 8,693,258 B2 * | 4/2014 | Weingarten ......... G11C 11/5628 365/185.2 |
| 8,799,748 B2 * | 8/2014 | Suzuki ................ G06F 11/1072 714/763 |
| 8,838,881 B2 * | 9/2014 | Patapoutian ........ G06F 12/0246 711/103 |
| 8,976,651 B2 * | 3/2015 | Nakao ................... H04W 28/08 370/230 |
| 9,147,501 B2 | 9/2015 | Hung et al. |
| 2008/0055997 A1 | 3/2008 | Lee |
| 2008/0068912 A1 | 3/2008 | Lee |
| 2010/0328995 A1 | 12/2010 | Shih et al. |
| 2012/0008394 A1 | 1/2012 | Lee et al. |
| 2013/0007344 A1 | 1/2013 | Belgal et al. |
| 2014/0063998 A1 | 3/2014 | Song |

* cited by examiner

RETENTION LOGIC FOR NON-VOLATILE MEMORY

RELATED APPLICATIONS

This application is a continuation of U.S. application Ser. No. 13/903,574 filed on 28 May 2013 (now U.S. Pat. No. 9,147,501) entitled Retention Logic for Non-Volatile Memory, which claims benefit of U.S. Provisional Patent Application No. 61/780,942 filed on 13 Mar. 2013, which application is incorporated by reference as if fully set forth herein.

BACKGROUND

Field of the Invention

The present invention relates to integrated circuit memory, and more particularly to data retention issues arising in non-volatile memory.

Description of Related Art

In flash memory devices, data is stored by trapping charge that establishes a cell threshold in memory cells. By sensing the cell threshold, data values can be read. However, as the memory cell sizes are reduced, charge retention, and therefore data retention, can suffer. In non-volatile memory devices configured to store data for long periods of time and through power-on/off events, data retention is an important performance factor.

It is desirable to provide technologies to improve non-volatile memory performance, and, in general, to improve data retention for integrated circuit memory.

SUMMARY

Non-volatile memory is described which includes retention check logic. The memory can comprise an integrated circuit having an array of memory cells configured to store data values using threshold states, including a higher threshold state. A controller includes retention check logic to identify memory cells in the higher threshold state which fail a threshold retention check, and logic to improve the threshold of the identified memory cells, such as by programming.

Other aspects and advantages of the present technology can be seen on review of the drawings, the detailed description and the claims, which follow.

DETAILED DESCRIPTION

A detailed description of embodiments of the present invention is provided with reference to the FIGS. 1-7.

Figure 1:
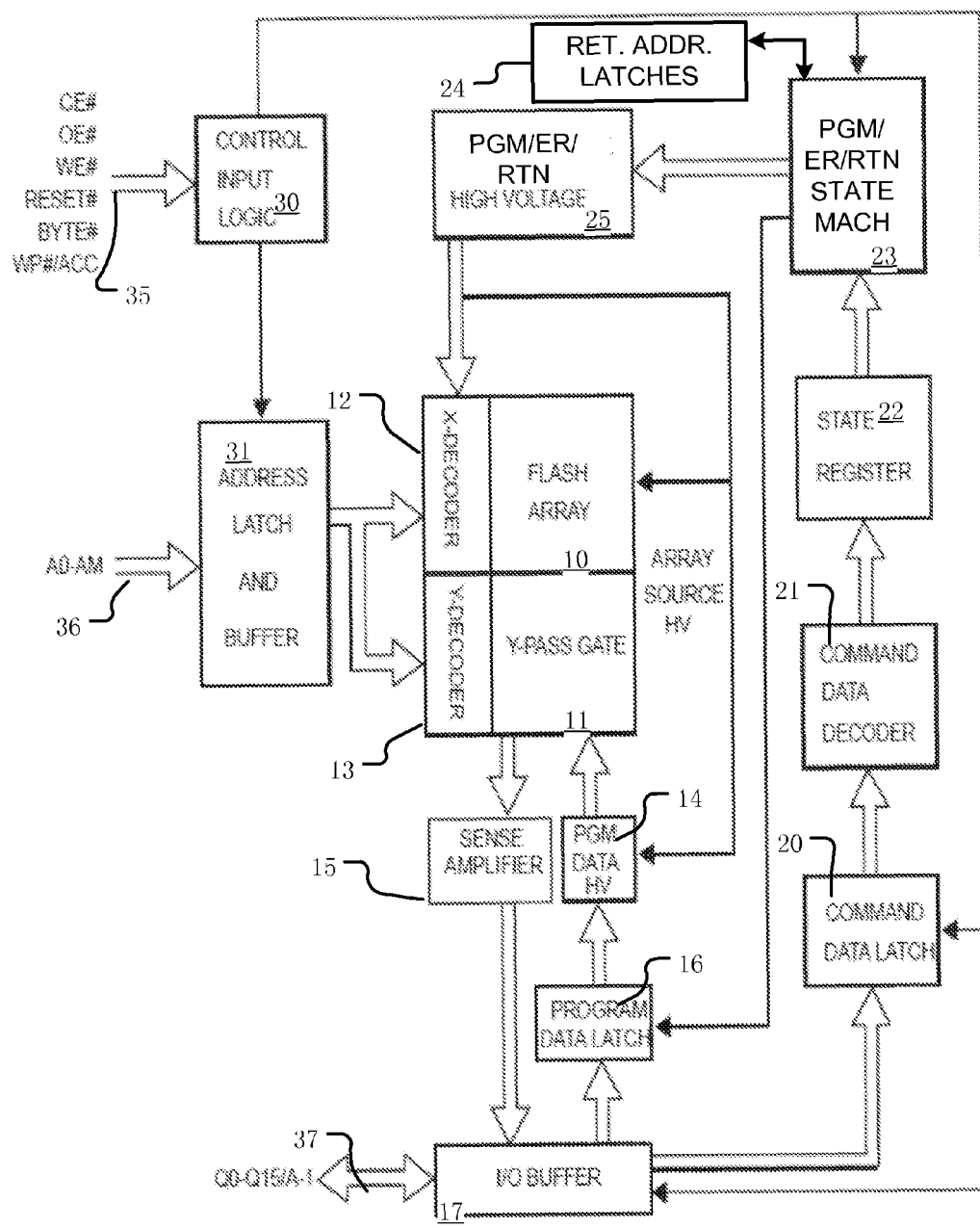
FIG. 1 is a simplified block diagram of an example of a flash memory integrated circuit implementing retention check logic.

FIG. 1 is a block diagram of an example of a flash memory integrated circuit including retention check logic and a retention write mode. Schematically, the integrated circuit includes a main flash array 10 having columns of non-volatile, charge trapping memory cells coupled to y-pass gates 11 and rows of cells coupled to an x-decoder 12. A y-decoder 13 is coupled to the y-pass gates 11. The y-pass gates 11 are coupled via a program data high-voltage circuit PGM DATA HV 14 to program data latches 16, which are in turn coupled to an input-output I/O buffer 17. Also, the y-pass gates 11 are coupled to sense amplifiers 15, which are in turn coupled to the input-output I/O buffer 17. The integrated circuit includes control input logic 30, an address latch and buffer 31, a command data latch 20, a command data decoder 21, a state register 22, and a state machine 23. The integrated circuit also includes program/erase/retention high-voltage circuits 25 which are coupled to the x-decoder 12. The state machine 23 is configured to operate in program, erase, read and retention modes as described in more detail below. In this example, the state machine 23 is coupled to a block of retention address latches 24, which can store a queue of addresses subject of a retention write process.

The control input logic 30 is connected to input pins 35 (CE#, OE#, WE#, RESET#, BYTE#, and WP#/ACC), and creates internal timing control signals to enable the address latch and buffer 31 to latch the external address pins 36 (A0-AM). The internal addresses are output from address latch and buffer 31 to the main array and decoders composed of x-decoder 12, y-decoder 13, y-pass gates 11, and flash array 10. The x-decoder 12 decodes the word-lines of the flash array, while the y-decoder 13 decodes the bit lines of the flash array. The bit lines are electrically connected to the sense amplifiers 15 and program data high-voltage circuit 14 selectively through the y-pass gates 11. Sense amplifiers 15 are used to read out the contents of the flash memory, while the program data high-voltage circuit block 14 is used to selectively deliver high power to bit-lines during programming. The I/O buffer 17 controls the input and output on the Q0-Q15/A-1 output pads 37. During read operation, the I/O buffer 17 receives data from sense amplifiers 15 and drives the output pads 37 accordingly. In the last cycle of program command, for example, the I/O buffer 17 transmits the data on output pads 37 (Q0-Q15/A-1) to program data latch 16, which controls the high power drivers in program data high-voltage circuit 14 to selectively program the bits in a word or byte according to the user input pattern.

The program/erase/retention high-voltage circuits 25 comprise the circuits to generate and deliver the necessary high voltage to the x-decoder 12, flash array 10, and program data high-voltage circuit 14 blocks.

The integrated circuit includes controller circuitry, including a logic control module comprised of the state machine 23, state register 22, command data decoder 21, and command data latch 20. When the user signals a command, for example by toggling WE#, the command on Q0-Q15/A-1 is latched in the command data latch 20 and is decoded by the command data decoder 21. The state register 22 receives the command and records the current state of the device. The state machine 23 implements the internal algorithms for program or erase according to the current command state by controlling each block in the block diagram. The flash memory array can be organized for Byte mode (×8) or Word mode (×16) read and write processes. In other embodiments, the integrated circuit can be configured for page mode read and write.

Also, the state machine 23 implements retention check algorithms including a retention read check and a retention write as described further below. In support of the retention check algorithms, a set of retention address latches 24 is provided as an address buffer which can be utilized to support the retention check processes. In other embodiments, the retention check processes can be implemented using logic on the integrated circuit apart from the state machine 23. In some implementations, the state machine 23, and any separate logic implementing the retention mode algorithms, can be implemented, in whole or in part, using dedicated logic circuitry defined using a high-level description language such as Verilog. In other implementations, one or more of the algorithms implementing retention check processes, program processes and erase processes can be implemented using an on-chip general purpose processor with suitable software. Also, combinations of dedicated logic and software controlled general-purpose processors can be applied to implement these algorithms.

In one aspect, the technology described herein comprises an array of memory cells, configured for access by a plurality of word lines and bit lines and to store data values in the memory cells using different threshold states. A controller, such as state machine 23 and supporting logic are configured in this aspect of the technology for biasing the word and bit lines associated to one of the memory cells to read out the threshold status thereof for example in a stand-by mode or a power-on mode. Retention check operations can take advantage of this stand-by mode read operation, as well as other memory management processes, or processes utilizing the memory for other reasons.

Figure 2:
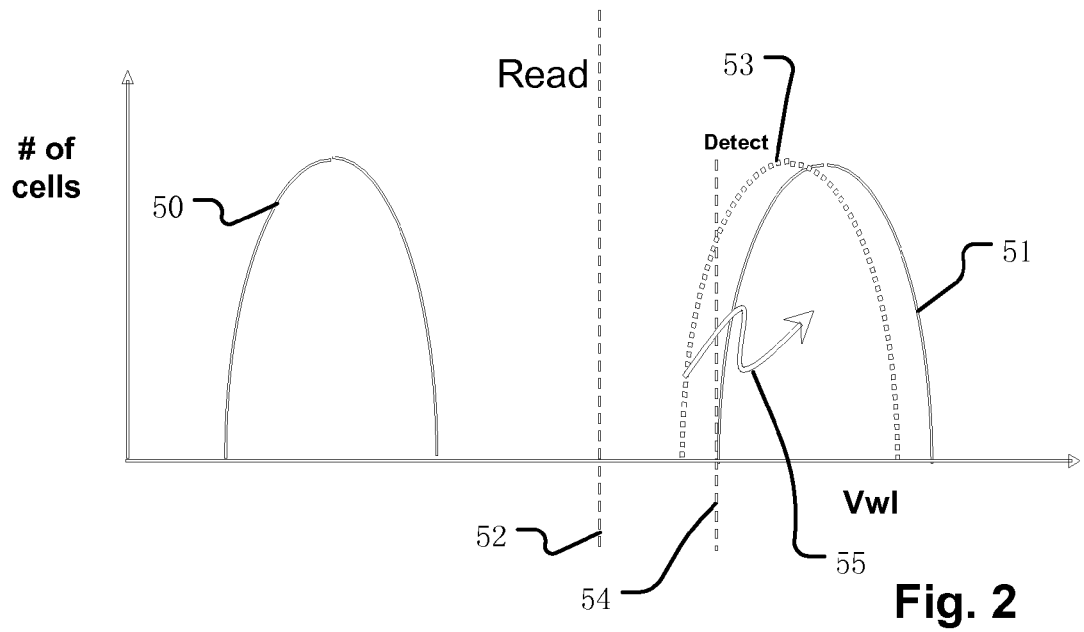
FIG. 2 is a simplified graph showing threshold voltage ranges for lower and higher threshold voltage states of single bit flash memory cells.

FIG. 2 is a simplified diagram showing distributions of threshold voltages for memory cells in a flash memory array. The vertical axis represents the number of cells having a particular threshold voltage (i.e. word line voltage at which the memory cell turns on sufficient for the sensing circuits), while the horizontal axis represents the word line voltage for the corresponding sample. For a single bit memory cell, there are two threshold distributions which are used to represent data values. A lower threshold distribution 50 corresponds to the lower threshold memory state for the memory cells in the array. A higher threshold distribution 51 corresponds to the higher threshold memory state for the memory cells. In a read mode, the memory device applies a read voltage at a voltage level 52 between the lower threshold distribution and the higher threshold distribution 51. The range between the maximum threshold voltage for the lower threshold distribution 50, and the minimum threshold voltage for the higher threshold distribution 51 represents a margin for successful reading of the memory cells.

In floating gate and charge trapping flash memory, as the technology progressively scales down in size, data retention may suffer because of charge leakage. Also, data retention can be an issue for other memory types. Data retention can suffer if the threshold voltages of the memory cells in the array drift during the life of the device. This phenomenon is represented by the shifted threshold distribution 53 shown in FIG. 2, where the memory cells that use trapped charge to set the threshold may lose charge over time, particularly when they are in the higher threshold state, resulting in a shift in their threshold voltage. This shift in the threshold voltage reduces the margin, and can cause reliability problems.

As described herein, logic is provided to perform a retention check of memory cells in a memory array. The retention check can include performing a test read using a read bias that includes a word line voltage such as at the level 54 to detect memory cells which are suffering a charge loss or another condition that leads to a reduction in their threshold voltage. Alternatively, the retention read can use other biasing techniques, including for example using a read bias using the same word line voltage as a normal read, while setting sensing biases at the sense amplifier or bit line load circuits to detect cells suffering from threshold drift. The retention check can involve detecting such memory cells, and then performing a retention write process represented by the arrow 55, which can increase the threshold voltage of the detected cells. This increase in threshold voltage places the cell threshold further away from the read bias, improving its condition for data retention.

The retention write process can be the same as a normal program sequence used in response to a program command. Alternatively, the retention write can be different from the normal program sequence. For example, the retention write may employ different voltages and/or different pulse widths than the normal program sequence. Also, the retention write may skip some steps used in normal program sequences. The use of different sequences for retention write than for normal program however can complicate the logic design, and so it may be preferred for some programming technologies, to use the same sequence for both.

Figure 3:
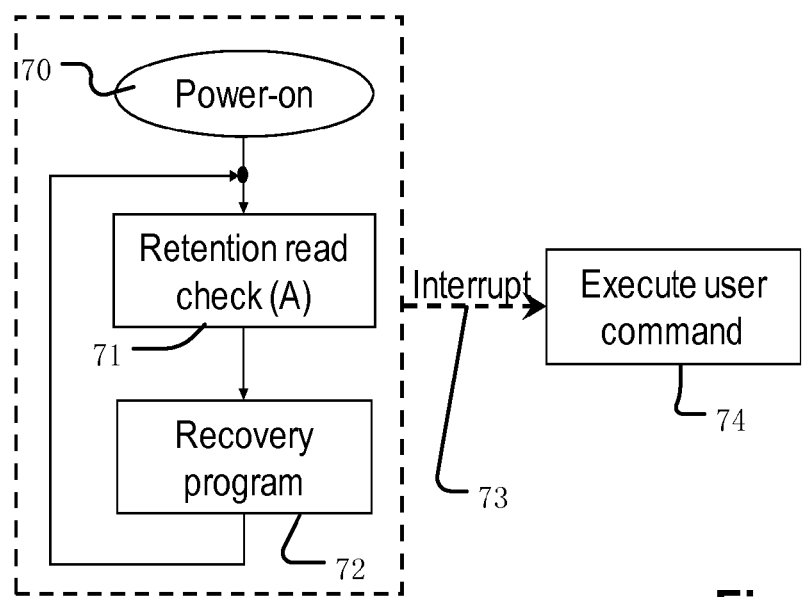
FIG. 3 is a simplified diagram of a retention check logic executed upon a power-on event on an integrated circuit memory.

In order to improve data retention, a retention check can be implemented that is executed after a power-on sequence for the device as illustrated in FIG. 3. According to the retention check shown in FIG. 3, when the device powers on (70), logic on the device executes a retention read check sequence 71 which can detect memory cells in the higher threshold memory state having a threshold voltage below a retention check threshold. After the retention read check sequence 71, or in a parallel or pipelined fashion, a retention write sequence 72 can be executed for any cell which fails the retention check. The addresses of cells which fail the retention check can be stored, preferably on the device, in case of an interruption before a retention write sequence is executed. The retention write sequence 72 can increase the threshold voltage of the cells identified during the retention read check sequence 71. This algorithm can continue until it is interrupted by a user command 73. Upon detection of a user command, the retention mode processing is suspended, such as in response to an interrupt signal, and the user command is executed (74). In this manner, the user command is treated with higher priority than the retention check process, and thereby causes little or no delay during mission functions of the device.

Typical modes for a flash memory include a read mode, and embedded write mode, and a stand-by mode. Retention mode processing can be executed during any of these modes. It can be desirable to execute mission function user commands with higher priority. So, logic is provided to suspend retention check sequences in favor of mission functions.

Figure 4:
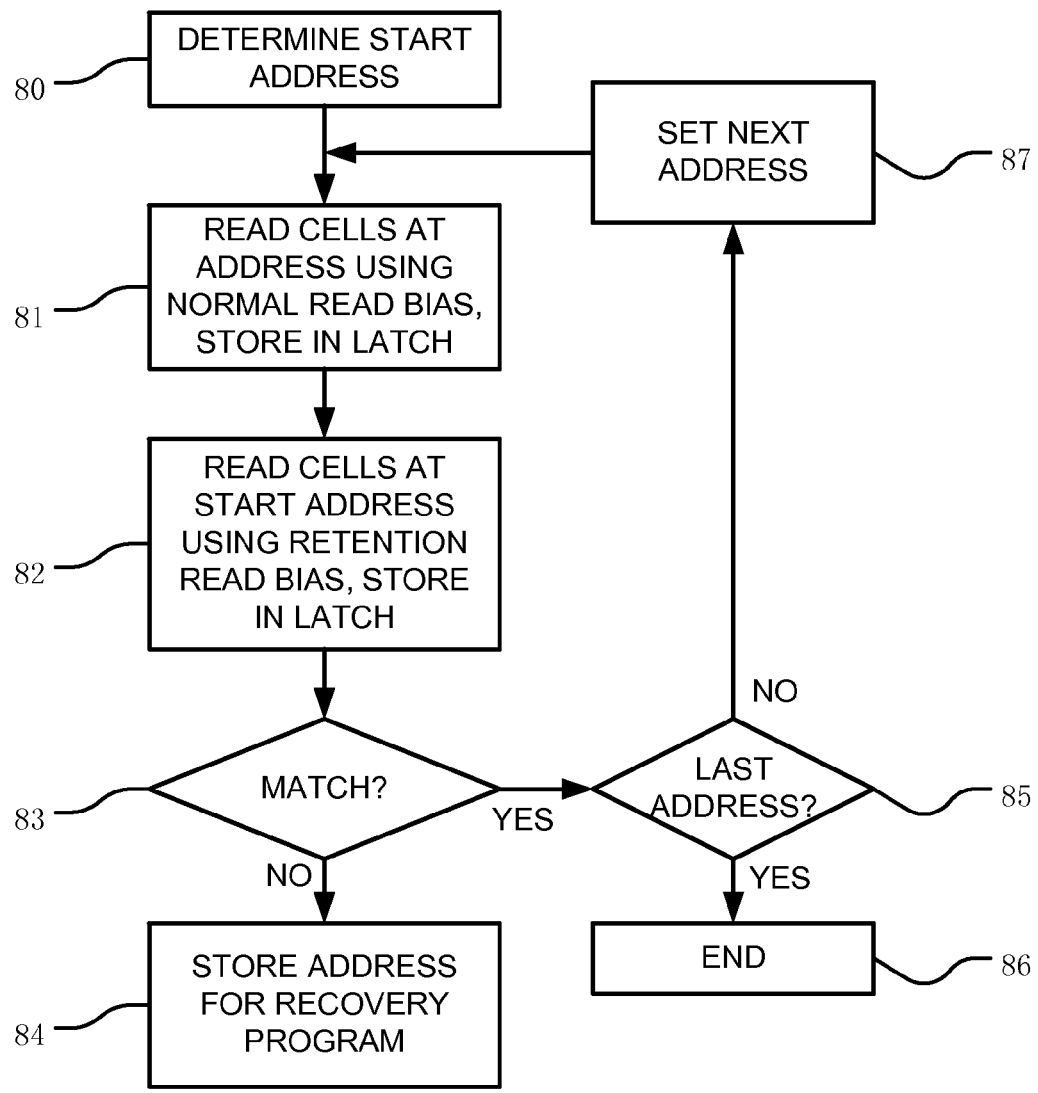
FIG. 4 is a simplified flow diagram for retention check logic which can be implemented on an integrated circuit memory.

FIG. 4 illustrates a representative retention check algorithm. The retention check algorithm can include a process which determines a start address (80). This start address can be determined randomly on the initiation of the retention check, provided the random start addresses of the retention checks can provide coverage for enough of the memory array to improve performance. In other examples, the start address can be determined algorithmically, using patterns that are likely to cover the entire array, or selected portions of the array, over a certain operating interval. Using random start addresses can simplify the logic needed to support the process, while giving reasonable assurance that all the cells in the memory array will be checked within suitable intervals of time.

After determining a start address, the retention check logic executes a sequence including reading memory cells iteratively across a set of addresses, which may identify a byte, word or page of memory cells for example. For each iteration, the cells are read using a normal read bias and the results stored in a latch if necessary for later processes (81). Also, cells are read using a retention read bias and stored in a latch if necessary for later processes (82). This read at the retention read bias can be limited to only those cells which are in the higher threshold state, as indicated by the read using the normal read bias. The results of the normal read bias read and the retention read bias read are compared (83). If the results do not match, then the retention check logic can store the address for use by a recovery program (84). The recovery program can include executing a retention write that comprises a standard program sequence to set a high threshold state in the memory cells which fail the retention read check. The recovery program can include a standard read followed by a re-program of the same data values on the byte, word or page level. In an alternative, the data from the retention read check which was taken at the normal read bias can be stored for use during the later recovery program. In yet other embodiments, the retention read process can store bit addresses, and the recovery program can be limited to individual bits.

The addresses stored at block 84 can be maintained in a queue of addresses for memory cells requiring a retention recovery program, using on-chip registers or latches for example. In this case, the retention recovery program can be executed later in time, and results of a retention read check can be maintained even in the event of an interrupt because of a user mode command.

If the results match at the test in step 83, then the retention check logic determines whether the last address in the sequence has been encountered (85). If yes, then this instance of the retention check is completed (86). If the last address in the sequence has not been encountered, then a next address is set (87). Then, a next iteration in the retention check logic is executed starting at block 81. The last address used for a given retention check sequence can be set so that each retention check sequence executes over only part of the array, limiting the amount of time that the device stays in a retention check. Alternatively, the last address used can be a constant value at the highest or lowest address used to access the array, so that the retention check sequence will continue from the beginning first start address determined at step 80, to the end of the memory array, or until the process is interrupted. In yet another alternative, the retention check process operates in a loop, storing the last address used for restarting the process, with no start or end address. For example, assuming a start address is for address bits A24:A0 equal to hex 123456, then the retention check look can proceed through address 123456, 123457, . . . , ffffff, 000000, . . . 123456 and so on. If an interrupt occurs, for example at address ffffff, the retention check address ffffff is stored for use as a starting address in a next cycle.

Figure 5:
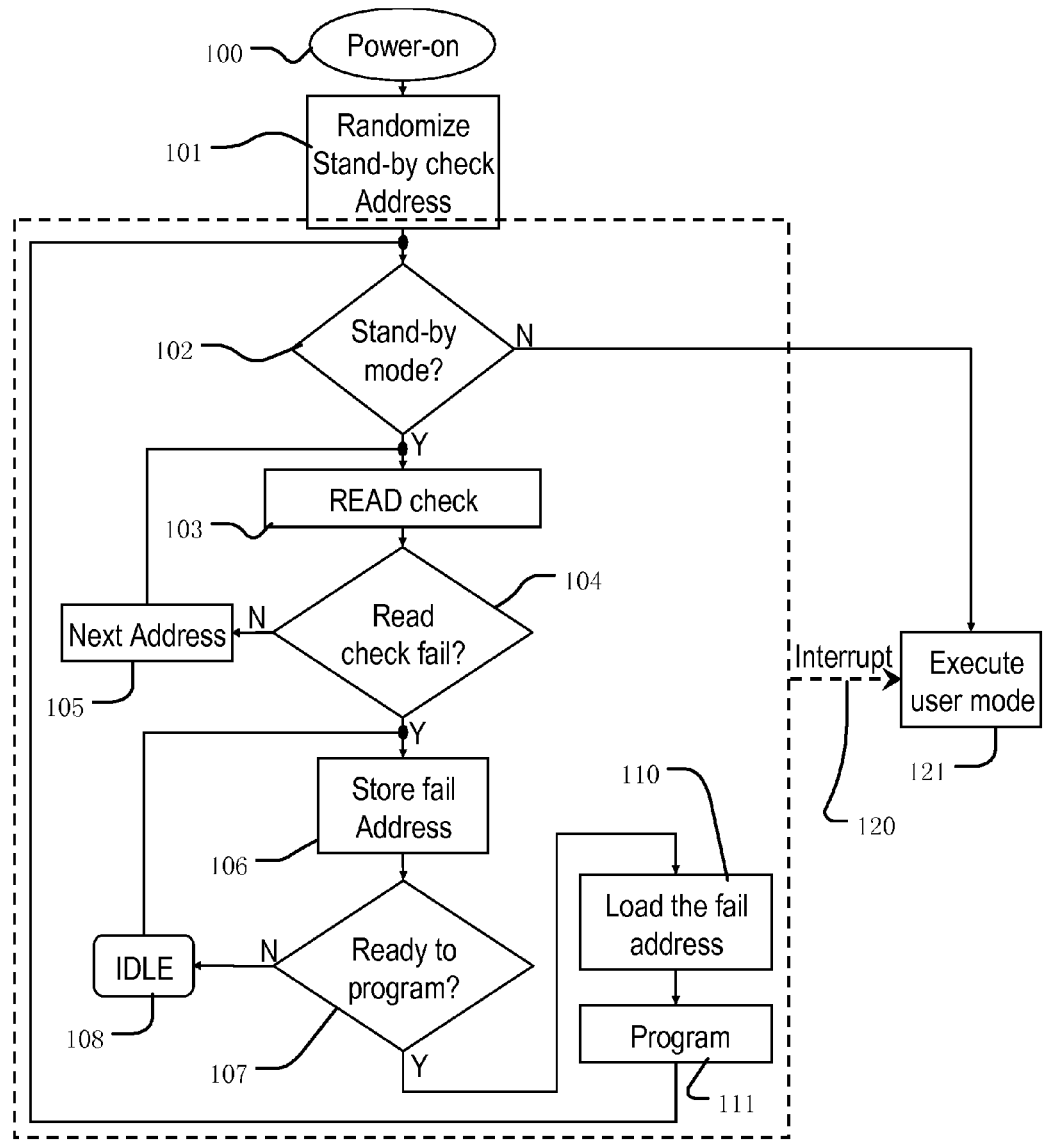
FIG. 5 is a simplified flow diagram for a retention check logic executed in a stand-by mode on an integrated circuit memory.

FIG. 5 illustrates a retention check process which can be executed during a stand-by mode on an integrated circuit memory. In this example, after a power-on event 100, a stand-by retention check address is produced using a random value (101). The check address can be produced in other ways as mentioned above. The control logic on the chip can enter the stand-by mode after power-on 100. In this case, loop is entered where the logic determines whether the chip remains in stand-by mode (102). If the logic remains in the stand-by mode, then a retention read check process is executed (103). During the retention read check process, the logic determines whether a retention check has failed for a particular address (104). If the retention check does not fail for the particular address, then the next address is provided (105), and the process loops to the next iteration starting at block 103. If at block 104, it is detected that the memory cell at a particular address failed the retention check, then the address of the failed memory cell is stored (106).

The logic determines whether the chip is ready to enter a retention program mode at step 107. The chip is ready if it meets conditions set by the logic, which conditions can depend on such factors as whether there is an address stored, the mode in which the chip is operating and specifications for operation of the chip. For example, the chip may be ready only if it is in stand-by mode. A disadvantage of doing the retention program in stand-by mode is that the chip will draw some current which may not be suitable for stand-by conditions. Alternatively, or in addition, the chip may be ready only if it is in user program mode, and the retention flow can be inserted before the user program operation, causing a small latency addition.

If the chip is not ready at step 107, then the algorithm can idle 108 to await program ready status. If the program is ready at step 107, then an address from the queue of addresses stored in the buffer and generated using the retention check is loaded (110), and a program operation is executed as a retention write (111). After the program operation as step 111, the logic can return to a wait state, in which it waits for the next time the controller enters the stand-by mode, as indicated by the loop to block 102.

If the power-on event is accompanied by a user command, then the retention check logic is not invoked, and rather as indicated at block 102, the user mode is executed as indicated by the command (121). If at power on, there is no user command, then the stand-by mode is entered, and the logic follows the branch at block 102 to perform the retention check. Also, at any time during the retention check, if a user command is received, then the process is interrupted (120) and the user command is executed (121).

Figure 6:
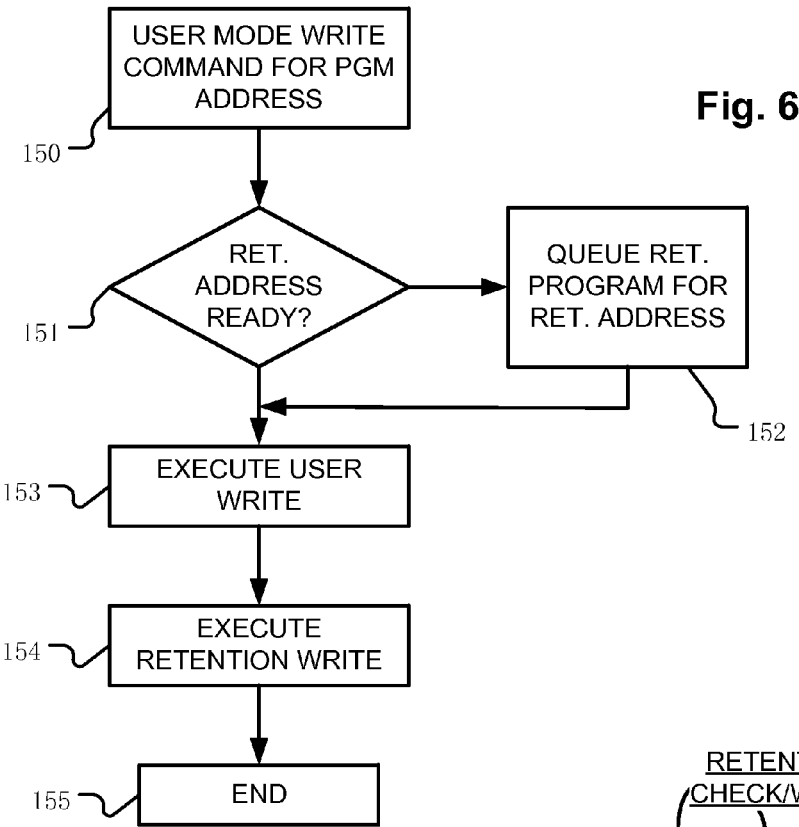
FIG. 6 is a simplified diagram of a modified write process implemented to support retention check logic as described herein.

FIG. 6 is a flowchart for a write process which has been modified to support retention check logic as described herein. In the case in which the addresses of memory cells which fail retention check have been stored in a buffer, and have not been reprogrammed due to an interrupt or for other reasons, the retention recovery step can be part of an embedded write command. In this example, as shown in FIG. 6, the device can be configured to begin a write process upon receipt of a user mode write command for a specific program address (150). During the write process, the logic can determine whether an address for a cell that fails the retention check process is ready for reprogramming (151). If there are addresses ready for retention reprogramming, then those addresses are queued with the program address carried by the command for retention write during the program sequence (152). The program sequence executes a user write using the program address carried by the program command (153). The program sequence also executes a retention write using the retention address stored in the retention address queue (154). After both write sequences have been performed, the program mode command is completed (155).

Figure 7:
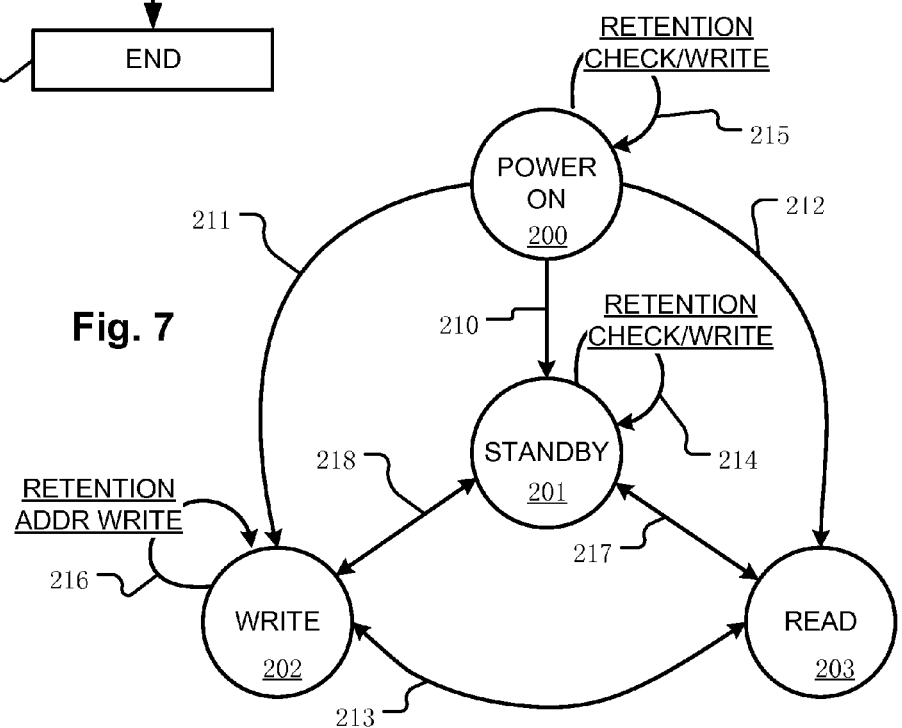
FIG. 7 is a simplified state diagram for an integrated circuit controller executing retention check logic as described herein.

FIG. 7 is a simplified state diagram for an integrated circuit which implements retention logic as described herein. In this simplified example, the integrated circuit has a power-on mode 200, a stand-by mode 201, a write mode 202, and a read mode 203. When power is supplied to the device, it enters the power-on mode 200. After the power-on sequence, the control logic transitions 210 to the stand-by mode 201, unless a read or write command is received. If a read or write command is received, then the control logic transitions 212 to the read mode 203 or transitions 211 to the write mode 202 as appropriate. After a write process in the write mode 202 is executed, then the logic can transition 218 to the stand-by mode 201. Also, from the write mode 202 for particular write commands, or if a read command is received during a write process, the logic can transition 213 to the read mode 203. Likewise, after a read process in the read mode 203, the logic can transition 217 to the stand-by mode 201. Also, from the read mode 203, for particular types of commands, or if a write command is received during a read process, logic can transition 213 to the write mode 202. As described above, during the stand-by mode 201 the control logic can execute the retention check and retention write algorithms as indicated by loop 214. In the alternative, the control logic on the chip during the power-on mode 200 can execute the retention check and retention write algorithms as indicated by loop 215. In some embodiments, the control logic can be configured to execute the retention check and retention write algorithms both during the power-on mode 200 and during the stand-by mode 201. Also, during a write mode 202, the logic can execute retention write algorithms is indicated by the loop 216. In general, the retention check and retention write algorithms can be executed by the on chip controller, for example, in non-user command modes. A non-user command mode is a mode such as stand-by mode, in which the memory is not being accessed in performance of a user command, and is therefore available for access in performance of the retention check and retention write algorithms The examples described herein involve memory cells configured to store one bit per cell. The technology can be applied as well to multi-level cells, or cells that store more than one bit per cell using a sequence of retention check reads at a corresponding sequence of retention read levels.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an array of memory cells, configured to store data values in memory cells in the array using threshold states, including a higher threshold state; and
a controller including retention check logic to identify memory cells in the higher threshold state having threshold voltages which fail a retention threshold check, and including logic to execute, responsive to the memory device entering any of a read mode and a write mode, a retention write on the identified memory cells in the higher threshold state.

2. The device of claim 1, wherein the controller implements a stand-by mode and one or more user modes, and the retention check logic executes in the stand-by mode.

3. The device of claim 2, wherein the controller is configured to enter the stand-by mode on power-up.

4. The device of claim 1, wherein the retention check logic executes a sequence including reading memory cells iteratively across addresses, where the iterative reading includes reading a memory cell at an address using a first read bias configured to read the data values stored in the memory cells, determining comparative values from the memory cells using a second read bias configured to indicate whether memory cells having the higher threshold state have a threshold voltage lower than specified retention threshold, comparing the data values and the comparative values, and if there is a match storing the address.

5. The device of claim 1, wherein the controller is configured to store addresses of memory cells which fail the retention check, and includes logic to enter a program mode in response to a user command to write data to selected cells, and to queue the stored addresses for programming to the high threshold state in the program mode.

6. The device of claim 1, wherein the controller is configured to interrupt the logic to identify memory cells which fail the threshold retention check if a read or program command is received.

7. The device of claim 1, wherein the logic executes, after receipt by the memory device of a read command and the memory device enters the read mode, the retention write on the identified memory cells in the higher threshold state.

8. The device of claim 1, wherein the logic executes, after receipt by the memory device of a write command and the memory device enters the write mode, the retention write on the identified memory cells in the higher threshold state.

9. A method of operating a memory device having an array of memory cells configured to store data values in memory cells in the array using threshold states, including a higher threshold state, comprising:
identifying memory cells in the higher threshold state which have threshold voltages that failed a retention threshold check; and
performing, responsive to the memory device entering any of a read mode and a write mode, a retention write process on the memory cells identified as a result of the retention threshold check.

10. The method of claim 9, wherein the memory device implements a stand-by mode and one or more user modes, and performs said retention threshold check in the stand-by mode.

11. The method of claim 9, wherein said identifying step includes reading memory cells iteratively across addresses, where an iteration includes reading a memory cell at an address using a first read bias configured to read the data values stored in the memory cells, determining comparative values from the memory cells using a second read bias configured to indicate whether memory cells having the higher threshold state have a threshold voltage lower than specified retention threshold, comparing the data values and the comparative values, and if there is a match storing the address.

12. The method of claim 9, including storing addresses of the identified memory cells, and queuing the stored addresses for programming to the high threshold state in a program mode entered in response to a user command to write data to selected cells.

13. The method of claim 9, including interrupting said retention threshold check if a read or program command is received.

14. The method of claim 9, wherein the memory cells in the array of memory cells are non-volatile, charge trapping memory cells, the memory device includes a stand-by mode, a write mode and a read mode, and wherein the retention threshold check executes during the stand-by mode, and the retention write process executes during one of the stand-by mode and the write mode.

15. The method of claim 14, including interrupting the retention threshold check if a user command is received.

16. The method of claim 9, wherein said performing the retention write process occurs, responsive to receipt by the memory device of a write command and the memory device entering the write mode.

17. The method of claim 9, wherein said performing the retention write process occurs, responsive to receipt by the memory device of a read command and the memory device entering the read mode.

18. A memory device, comprising:
- an array of memory cells, configured for access by a plurality of word lines and bit lines and to store data values in the memory cells using different threshold states;
- a controller including retention check logic which executes a sequence including reading memory cells iteratively across addresses, where the iterative reading includes reading a memory cell at an address using a first read bias configured to read the data values stored in the memory cells, determining comparative values from the memory cells using a second read bias configured to indicate whether memory cells having a particular threshold state have a threshold voltage lower than a specified retention threshold, and storing the addresses of memory cells for which the data values and the comparative values do not match; and
- logic to execute a retention write of the memory cells identified by the stored addresses, responsive to the memory device entering any of a read mode and a write mode.

19. The memory device of claim 18, wherein the logic executes the retention write after receipt by the memory device of a read command and the memory device enters the read mode.

20. The memory device of claim 18, wherein the logic executes the retention write after receipt by the memory device of the write command and the memory device enters the write mode.

* * * * *